US012685214B2

(12) United States Patent
Kim

(10) Patent No.: US 12,685,214 B2
(45) Date of Patent: Jul. 14, 2026

(54) SEMICONDUCTOR DEVICES AND METHODS OF MANUFACTURING SEMICONDUCTOR DEVICES

(71) Applicant: Amkor Technology Singapore Holding Pte. Ltd., Singapore (SG)

(72) Inventor: Jae Yun Kim, Gyeonggi-do (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 660 days.

(21) Appl. No.: 18/082,012

(22) Filed: Dec. 15, 2022

(65) Prior Publication Data

US 2024/0203803 A1 Jun. 20, 2024

(51) Int. Cl.
| | |
|---|---|
| *H01L 23/053* | (2006.01) |
| *H10W 70/05* | (2026.01) |
| *H10W 70/65* | (2026.01) |
| *H10W 74/01* | (2026.01) |
| *H10W 74/10* | (2026.01) |
| *H10W 74/15* | (2026.01) |
| *H10W 76/01* | (2026.01) |
| *H10W 76/15* | (2026.01) |
| *H10W 90/00* | (2026.01) |

(52) U.S. Cl.
CPC ......... *H10W 76/15* (2026.01); *H10W 70/093* (2026.01); *H10W 70/65* (2026.01); *H10W 74/012* (2026.01); *H10W 74/141* (2026.01); *H10W 74/15* (2026.01); *H10W 76/01*

(2026.01); *H10W 90/701* (2026.01); *H10W 74/142* (2026.01); *H10W 90/724* (2026.01)

(58) Field of Classification Search
None
See application file for complete search history.

(56) References Cited

U.S. PATENT DOCUMENTS

2019/0244907 A1* 8/2019 Liao ..................... H01L 23/5389
2021/0096310 A1* 4/2021 Chang ..................... H01L 24/19

* cited by examiner

*Primary Examiner* — Long Pham
(74) *Attorney, Agent, or Firm* — Spectrum IP Law Group LLC

(57) ABSTRACT

In one example, an electronic device comprises a substrate comprising a top side, a bottom side, a lateral side, and a conductive structure, a first electronic component over the top side of the substrate and coupled with the conductive structure, an encapsulant contacting the top side of the substrate, the bottom side of the substrate, and the lateral side of the substrate, a lid over the first electronic component and over the encapsulant, and a second electronic component over the top side of the substrate and coupled with the conductive structure, wherein the second electronic component is between the first electronic component and the lateral side of the substrate. Other examples and related methods are also disclosed herein.

22 Claims, 10 Drawing Sheets

SEMICONDUCTOR DEVICES AND METHODS OF MANUFACTURING SEMICONDUCTOR DEVICES

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, resulting in, for example, excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

Figures 1, 2A:
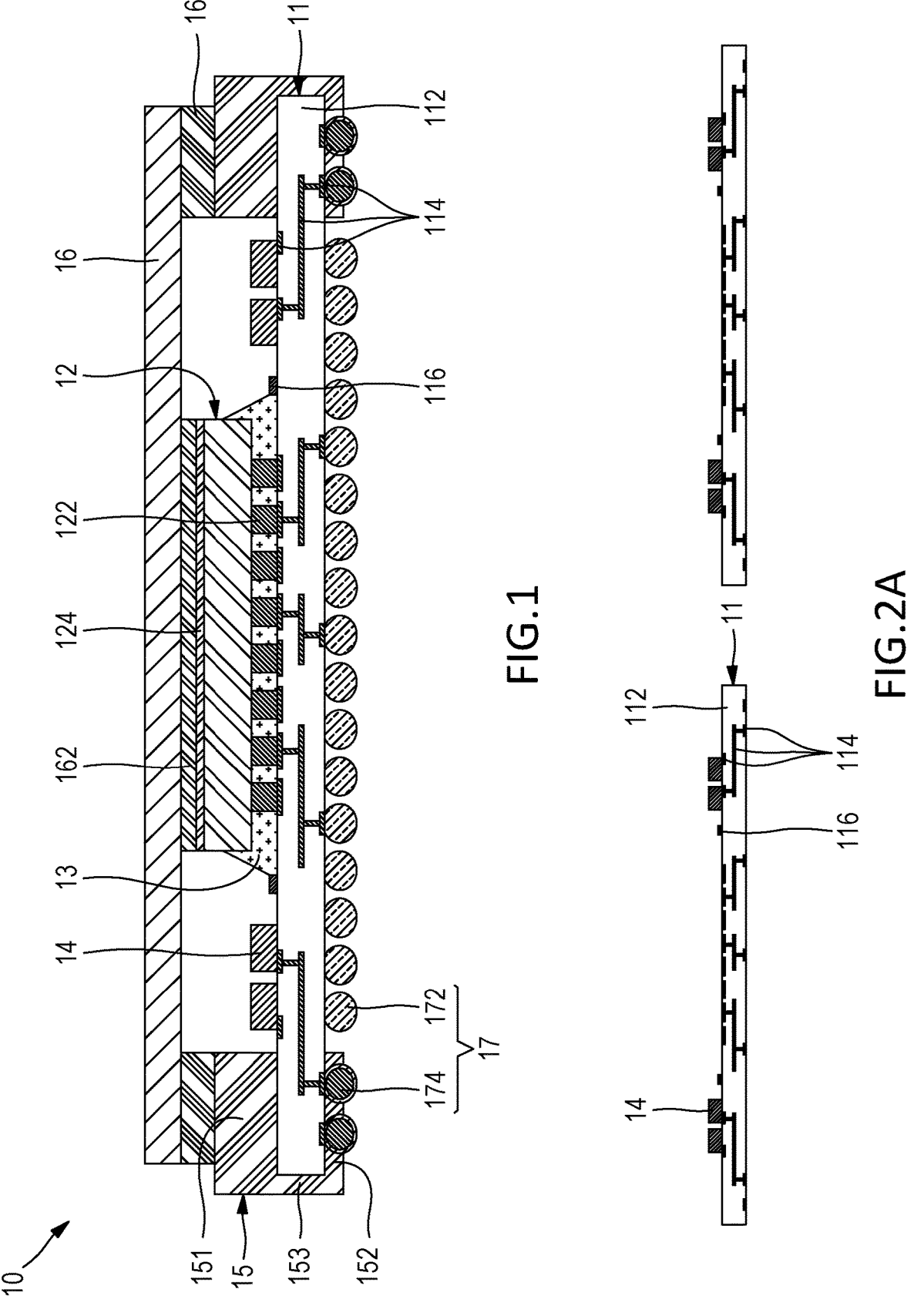
FIG. 1 shows a cross-sectional view of an example electronic device.
FIGS. 2A to 2G show cross-sectional views of an example method for manufacturing an example electronic device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g.," are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. Crosshatching lines may be used throughout the figures to denote different parts but not necessarily to denote the same or different materials. Throughout the present disclosure, like reference numbers denote like elements. Accordingly, elements with like element numbering may be shown in the figures but may not be necessarily repeated herein for the sake of clarity.

The term "or" means any one or more of the items in the list joined by "or". As an example, "x or y" means any element of the three-element set $\{(x), (y), (x, y)\}$. As another example, "x, y, or z" means any element of the seven-element set $\{(x), (y), (z), (x, y), (x, z), (y, z), (x, y, z)\}$.

The terms "comprises," "comprising," "includes," and "including" are "open ended" terms and specify the presence of stated features, but do not preclude the presence or addition of one or more other features. The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or to describe two elements indirectly connected by one or more other elements. For example, if element A is coupled to element B, then element A can be directly contacting element B or indirectly connected to element B by an intervening element C. As used herein, the term "coupled" can refer to an electrical coupling or a mechanical coupling. Similarly, the terms "over" or "on" may be used to describe two elements directly contacting each other or to describe two elements indirectly connected by one or more other elements.

DESCRIPTION

In one example, an electronic device comprises a substrate comprising a top side, a bottom side, a lateral side, and a conductive structure, a first electronic component over the top side of the substrate and coupled with the conductive structure, an encapsulant contacting the top side of the substrate, the bottom side of the substrate, and the lateral side of the substrate, a lid over the first electronic component and over the encapsulant, and a second electronic component over the top side of the substrate and coupled with the conductive structure, wherein the second electronic component is between the first electronic component and the lateral side of the substrate.

In another example, an electronic device comprises a substrate comprising a top side, a bottom side, a lateral side, and a conductive structure, a first electronic component over the top side of the substrate and coupled with the conductive structure, wherein the first electronic component comprises a component interconnect on a bottom side of the first electronic component, a second electronic component over the top side of the substrate and coupled with the conductive structure, an encapsulant contacting the top side of the substrate, the bottom side of the substrate, and the lateral side of the substrate, a lid over the first electronic component, over the second electronic component, and over the encapsulant, and an underfill between the top side of the substrate and the bottom side of the first electronic component and contacting the component interconnect, wherein the second electronic component is external to the underfill.

In a further example, a method to manufacture an electronic device comprises providing a substrate comprising a top side, a bottom side, a lateral side, a conductive structure, and a first electronic component over the top side of the substrate and coupled with the conductive structure, providing a top mold chase over the top side of the substrate and a bottom mold chase below the bottom side of the substrate, wherein the top mold chase has a first cavity between a first bar and a second bar, wherein the bottom mold chase has a second cavity, providing an encapsulant contacting the top side of the substrate, the bottom side of the substrate, and the lateral side of the substrate, wherein the encapsulant is external to the first cavity and is in the second cavity, removing the top mold chase and the bottom mold chase, providing a second electronic component over the top side of the substrate and coupled with the conductive structure, and providing a lid over the top side of the substrate, wherein the lid is over the first electronic component, the second electronic component, and the encapsulant.

Other examples are included in the present disclosure. Such examples may be found in the figures, in the claims, or in the description of the present disclosure.

FIG. 1 shows a cross-sectional view of an example electronic device 10. In the example shown in FIG. 1, electronic device 10 can comprise substrate 11, electronic component 12 and electronic components 14, underfill 13, encapsulant 15, lid 16, and external interconnects 17 which can include solder ball external interconnects 172 or solder balls 174.

Substrate 11 can comprise dielectric structure 112, conductive structure 114, and one or more dams 116. Electronic component 12 can comprise component interconnects 122 and back side metallization (BSM) 124. Encapsulant 15 can comprise top portion 151, bottom portion 152, and side portion 153. Lid 16 can comprise thermal interface material (TIM) 162 and adhesive 164. In some examples, top portion 151 of encapsulant 15 can contact the top side of substrate 11, side portion 153 of encapsulant 15 can contact the lateral side of substrate 11, and bottom portion 152 of encapsulant 15 can contact the bottom side of substrate 11. Lid 16 can be over electronic component 12 and over encapsulant 15. Electronic components 14 can be over the top side of substrate 11 and can be coupled with conductive structure 114. Electronic components 14 can be between electronic component 12 and the lateral side of substrate 11, and electronic components 14 can be external to encapsulant 15.

Substrate 11, encapsulant 15, lid 16, and external interconnects 17 can comprise or be referred to as an electronic package or a package. The electronic package can protect electronic component 12 and electronic components 14 from exposure to external factors or environments. The electronic package can provide a coupling between electronic component 12 and electronic components 14 and between electronic component 12 and electronic components 14 and external components or other electronic packages.

FIGS. 2A to 2G show cross-sectional views of an example method for manufacturing an example electronic device 10. FIG. 2A shows a cross-sectional view of electronic device 10 at an early stage of manufacture.

In the example shown in FIG. 2A, substrate 11 can be provided. In some examples, substrate 11 can comprise or be referred to as a rigid or flexible laminate substrate, a ceramic substrate, a redistribution layer (RDL) substrate, a glass substrate, a silicon (Si) substrate, or a leadframe. In some examples, a plurality of discrete substrates 11 can be provided separately from one another. In some examples, the thickness of each substrate 11 can range from about 100 micrometers (μm) to about 700 μm.

In accordance with various examples, substrate 11 can include dielectric structure 112 and conductive structure 114. In some examples, dielectric structure 112 can comprise or be referred to one or more dielectrics, dielectric materials, dielectric layers, passivation layers, insulating layers, or protective layers. In some examples, dielectric structure 112 can have a structure in which one or more dielectric layers are stacked. In some examples, dielectric structure 112 can comprise polymer, polyimide (PI), benzocyclobutene (BCB), polybenzoxazole (PBO), bismaleimide triazine (BT), a molding material, phenolic resin, epoxy, silicone, or acrylate polymer. Dielectric structure 112 can be in contact with conductive structure 114. Dielectric structure 112 can expose parts of conductive structure 114. In some examples, dielectric structure 112 can maintain the external shape of substrate 11 and can structurally support conductive structure 114. In some examples, dielectric structure 112 can be provided by spin coating, spray coating, printing, oxidation, physical vapor deposition (PVD), chemical vapor deposition (CVD), metal organic chemical vapor deposition (MOCVD), atomic layer deposition (ALD), low pressure chemical vapor deposition (LPCVD), or plasma enhanced chemical vapor deposition (PECVD). In some examples, the thicknesses of individual layers of dielectric structure 112 can range from about 3 μm to about 50 μm. The combined thickness of all layers of dielectric structure 112 can define the thickness of substrate 11.

In some examples, conductive structure 114 can comprise or be referred to as one or more conductors, conductive materials, conductive paths, conductive layers, redistribution layers, wiring layers, traces, vias, pads, or under bump metallizations (UBMs). In some examples, one or more of the conductive layers of conductive structure 114 may be interleaved with the dielectric layers of dielectric structure 112. In some examples, conductive structure 114 can comprise copper, aluminum, palladium, titanium, tungsten, titanium/tungsten, nickel, gold or silver. In some examples, conductive structure 114 can be provided by sputtering, electroless plating, electrolytic plating, PVD, CVD, MOCVD, ALD, LPCVD, or PECVD. In some examples, parts of conductive structure 114 be exposed to the top side and the bottom side of substrate 11. Conductive structure 114 can transmit signals, currents, or voltages within substrate 11. In some examples, the thickness of conductive structure 114 can range from about 3 μm to about 35 μm. The thickness of conductive structure 114 can refer to individual layers of conductive structure 114.

In some examples, substrate 11 can be a redistribution layer ("RDL") substrate. RDL substrates can comprise one or more conductive redistribution layers and one or more dielectric layers and (a) can be formed layer by layer over an electronic device to which the RDL substrate is to be coupled, or (b) can be formed layer by layer over a carrier and then entirely removed or at least partially removed after the electronic device and the RDL substrate are coupled together. RDL substrates can be manufactured layer by layer as a wafer-level substrate on a round wafer in a wafer-level process, and/or as a panel-level substrate on a rectangular or square panel carrier in a panel-level process. RDL substrates can be formed in an additive buildup process and can include one or more dielectric layers alternatingly stacked with one or more conductive layers and define respective conductive redistribution patterns or traces configured to collectively (a) fan-out electrical traces outside the footprint of the electronic device, and/or (b) fan-in electrical traces within the footprint of the electronic device. The conductive patterns can be formed using a plating process such as, for example, an electroplating process or an electroless plating process. The conductive patterns can comprise a conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process and can include a photolithographic mask through where light is exposed to photo-pattern desired features such as vias in the dielectric layers. The dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, and could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in some examples the dielectric materials of the RDL substrates can comprise one or more inorganic dielectric layers. Some examples of inorganic dielectric layers can comprise silicon nitride (Si3N4), silicon oxide (SiO2), or silicon oxynitride (SiON). The inorganic dielectric layers can be formed by growing the inorganic dielectric layers using an oxidation or nitridization process rather than using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can comprise or be referred to as a coreless substrate. Substrates, as disclosed herein, can comprise RDL substrates In some examples, substrate 11 can be a pre-formed substrate. Pre-formed substrates can be manufactured prior to attachment to an electronic device and can comprise dielectric layers between respective conductive layers. The conductive layers can comprise, for example, copper and can be formed using an electroplating process. The dielectric layers can be non-photo-definable layers that can be attached as a pre-formed film rather than as a liquid and can include a resin with fillers such as strands, weaves, or other inorganic particles for rigidity or structural support. Since the dielectric layers are non-photo-definable, features such as vias or openings can be formed using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate omitting the permanent core structure, and the dielectric and conductive layers can be formed on a sacrificial carrier that is removed after formation of the dielectric and conductive layers and before attachment to the electronic device. The pre-formed substrate can referred to as a printed circuit board (PCB) or a laminate substrate. Such pre-formed substrates can be formed through a semi-additive or modified-semi-additive process. Substrates, as disclosed herein, can comprise pre-formed substrates.

In accordance with various examples, electronic components 14 can be provided on substrate 11. Electronic components 14 be coupled to conductive structure 114 of substrate 11. In some examples, electronic components 14 can be coupled to conductive structure 114 using a mass reflow process, a thermal compression process, or a laser bonding process. In some examples, one or more of the electronic components 14 can comprise or be referred to as a passive device or a passive component. For example, electronic component 14 can comprise a capacitor, an inductor, or a resistor. In some examples, the locations of electronic components 14 can be selected such that electronic components 14 are located outside electronic component 12 as shown in FIG. 1. For example, electronic components 14 may be located closer to the lateral side of substrate 11 as compared to electronic component 12 as shown in FIG. 1. In some examples, the height of electronic component 14 can range from about 50 μm to about 600 μm.

In some examples, dam 116 can be provided on substrate 11. In some examples, dam 116 can comprise a solder resist or a dielectric material. Dam 116 can be located inside electronic components 14. For example, electronic components 14 can be located closer to the lateral sides of substrate as compared to dam 16. In some examples, dam 116 can be a single, continuous structure. In other examples, dam 116 can comprise a plurality of discrete, discontinuous structures provided outside electronic component 12 as shown in FIG. 1. In some examples, dam 116 can be provided by spin coating, spray coating, printing, oxidation, PVD, CVD, MOCVD, ALD, LPCVD, or PECVD. In some examples, the thickness of dam 116 can range from about 5 μm to about 25 μm.

Figures 2B, 2C:
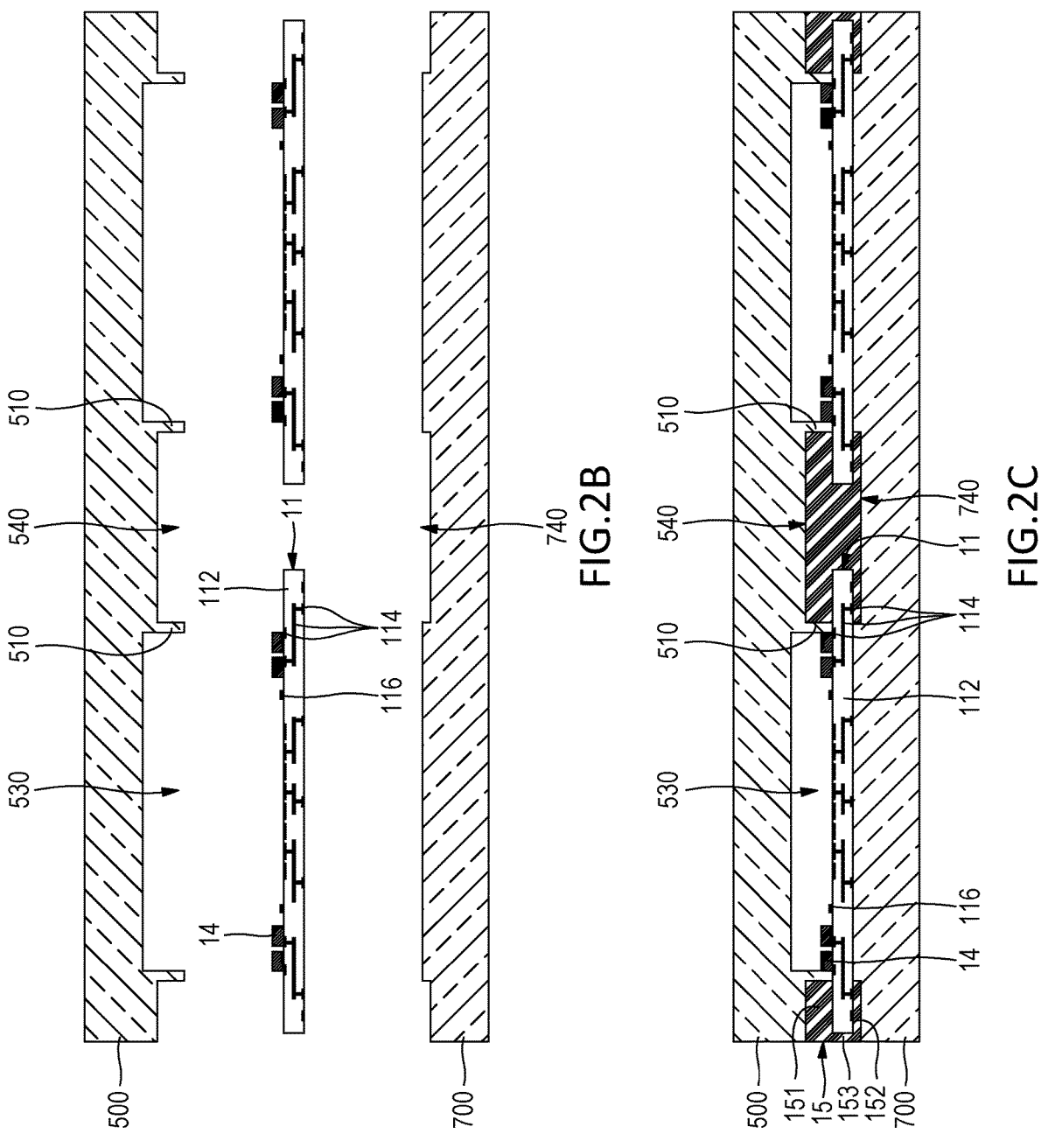

FIG. 2B shows a cross-sectional view of electronic device 10 at a later stage of manufacture. In the example shown in FIG. 2B, substrates 11 can be disposed between top mold chase 500 and bottom mold chase 700. Top mold chase 500 and bottom mold chase 700 can include or define multiple mold cavities such that multiple substrates 11 can be molded at once, for example simultaneously.

Figures 2D, 2E:
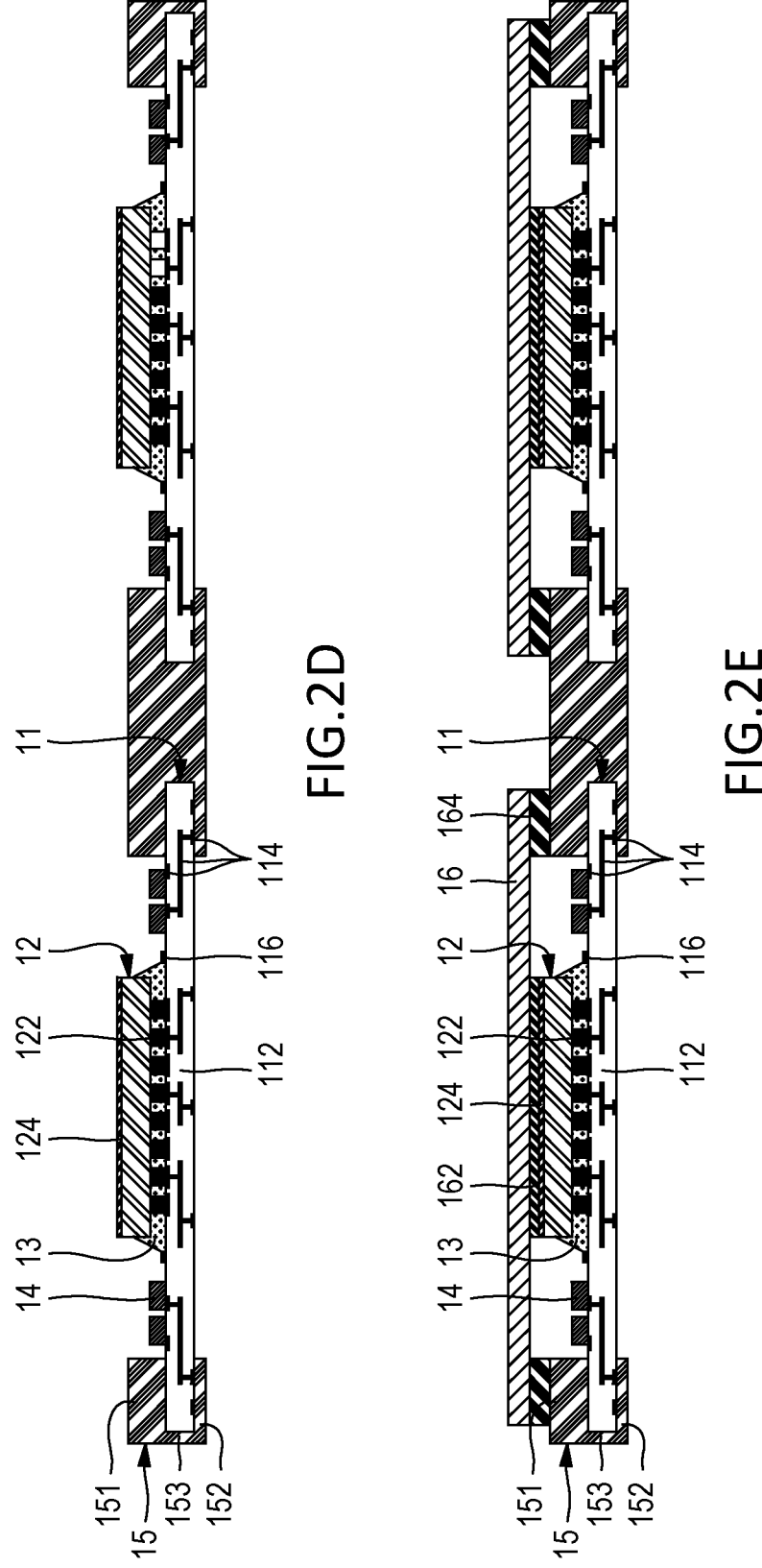

Top mold chase 500 can comprise bar 510 and cavities 530 and 540. In some examples, bar 510 can comprise or be referred to as a protrusion. Bar 510 can separate cavity 530 from cavity 540. Bar 510 can protrude downward from top mold chase 500 and can contact the top side of substrate 11. In some examples, bar 510 can define or comprise sidewalls of cavities 530 and 540. Bar 510 can be provided outside electronic components 14. Cavity 530 can be provided at the general center of substrate 11. The location of cavity 530 can correspond to the location of electronic component 12 as shown in FIG. 2D over substrate 11. In some examples, electronic component 14 and dam 116 can be located within cavity 530. Cavity 540 can be provided proximate the edge of substrate 11 and can be a space for molding can be provided, for example encapsulant 15 in FIG. 2C. In some examples, cavity 540 can be extend continuously around a perimeter of cavity 530.

Bottom mold chase 700 can comprise cavity 740. Bottom mold chase 700 can contact the bottom side of substrate 11. Bottom mold chase 700 can support substrates 11. Cavity 740 can be provided proximate the edge of substrate 11 and can be a space for molding can be provided, encapsulant 15. Cavity 740 can be coupled with cavity 540, for example fluidly coupled, such that cavities 740 and 540 together form a single cavity configured to contain molding. In some examples, the width of cavity 740, as defined between opposite sidewalls of cavity 740, can be equal to the width of cavity 540 as defined between opposite sidewalls of cavity 540.

FIG. 2C shows a cross-sectional view of electronic device 10 at a later stage of manufacture. In the example shown in FIG. 2C, encapsulant 15 can be provided within cavities 540 and 740. Encapsulant 15 can be molded or coupled to the edge of substrate 11. In some examples, encapsulant 15 can comprise or be referred to as epoxy, resin, polymer, a mold compound, a protective material, or a mold material. Encapsulant 15 can support substrates 11 at the same time and can reduce the warpage of substrate 11. In some examples, encapsulant 15 can provide multiple substrates 11 in the form of a single panel or strip. In some examples, encapsulant 15 can extend continuously around the perimeter of each substrate 11.

Encapsulant 15 can comprise top portion 151 located over the top side of substrate 11, bottom portion 152 located under the bottom side of substrate 11, and side portion 153 located along the lateral sides of substrate 11. For example, substrate 11 can be sandwiched between top portion 151 and bottom portion 152 of encapsulant 15, with side portion 153 extending between top portion 151 and bottom portion 152. Top portion 151 of encapsulant 15 can be provided outside electronic components 14. In some examples, top portion 151 of encapsulant 15 can cover or contact portions of conductive structure 114 exposed at the top side of substrate 11, and bottom portion 152 of encapsulant 15 can cover or contact portions of conductive structure 114 exposed at the bottom side of substrate 11. The width of top portion 151 of encapsulant 15 can be equal to the width of bottom portion 152. In some examples, the thickness of top portion 151 can range from about 200 μm to about 1000 μm, the thickness of bottom portion 152 can range from about 20 μm to about 150 μm, and the width of side portion 153 can range from about 10 μm to about 500 μm.

FIG. 2D shows a cross-sectional view of electronic device 10 at a later stage of manufacture. In the example shown in FIG. 2D, electronic component 12 can be provided on substrate 11. Electronic component 12 can be coupled to conductive structure 114 of substrate 11. In some examples, electronic component 12 can be coupled to conductive structure 114 by a mass reflow process, a thermal compression process, or a laser bonding process. In some examples, electronic components 14 can be provided on substrate 11 together with electronic component 12, for example after depositing encapsulant 15 around substrates 11.

In some examples, electronic component 12 can comprise or be referred to as one or more dies, chips, or packages. In some examples, electronic component 12 can comprise a memory, a digital signal processor (DSP), a microprocessor, a network processor, a power management processor, an audio processor, a radio-frequency (RF) circuit, a wireless baseband system-on-chip (SoC) processor, a sensor, or an electrical circuit, such as an application specific integrated circuit (ASIC). In some examples, the height of electronic component 12 can range from about 100 μm to about 780 μm.

In accordance with various examples, component interconnects 122 can be provided as electrical couplings between electronic component 12 and substrate 11. Component interconnects 122 can be coupled to conductive structure 114. In some examples, component interconnects 122 can comprise or be referred to as bumps, pillars, pads, or solder balls. Component interconnects 122 can be provided on the bottom side of electronic component 12. In some examples, component interconnects 122 can comprise copper, aluminum, palladium, titanium, tungsten, titanium/ tungsten, nickel, gold, or silver. In some examples, the thickness of component interconnect 122 can range from about 30 μm to about 100 μm.

In some examples, back side metallization (BSM) 124 can be provided on the top side of electronic component 12, or a side opposite to the side where component interconnects 122 are provided. In some examples, BSM 124 can comprise or be referred to as a metal layer or a conductive layer. In some examples, BSM 124 can comprise nickel, titanium, silver, vanadium, or gold. BSM 124 can entirely cover the top side of electronic component 12. In some examples, BSM 124 can be provided by sputtering, electroless plating, PVD, CVD, MOCVD, ALD, LPCVD, or PECVD. In some examples, BSM 124 can transfer heat generated from electronic component 12 to lid 16. In some examples, the thickness of BSM 124 can range from about 0.5 μm to about 10 μm.

In some examples, underfill 13 can be provided between electronic component 12 and substrate 11. In some examples, underfill 13 can comprise or be referred to as capillary underfill (CUF), non-conductive paste (NCP), non-conductive film (NCF), or anisotropic conductive film (ACF). In some examples, underfill 13 can comprise epoxy, a thermoplastic material, a thermosetting material, polyimide, polyurethane, a polymeric material, filled epoxy, a filled thermoplastic material, a filled thermosetting material, filled polyimide, filled polyurethane, a filled polymeric material, or a fluxing underfill. Underfill 13 can wrap up component interconnects 122. Underfill 13 can be in contact with the top side of substrate 11 and the bottom side of electronic component 12. In some examples, underfill 13 can cover portions of lateral sides of electronic component 12. In some examples, underfill 13 can be provided inside dam 116. In some examples, underfill 13 can prevent electronic component 12 from being separated from substrate 11 by physical or chemical impact. In some examples, the thickness of underfill 13 can range from about 50 μm to about 780 μm. Dam 116 tends to prevent, or reduce occurrences, of underfill 13 from flowing into electronic component 14. In some examples, dam 116 can be on the top side of substrate 11, and dam 116 can be between underfill 13 and electronic component 14. Electronic component 14 can be external to underfill 13.

FIG. 2E shows a cross-sectional view of electronic device 10 at a later stage of manufacture. In the example shown in FIG. 2E, lid 16 can be provided on substrate 11. In some examples, lid 16 can entirely cover the top side of substrate 11. In some examples, the size or area of lid 16 can correspond to the size or area of substrate 11. In some examples, lid 16 can expose side portion 153 of encapsulant 15 for molding lateral sides of substrate 11. In some examples, lid 16 can comprise or be referred to as a cover, a cover structure, a cap, or a roof. In some examples, lid 16 can comprise a metal material, such as copper, copper alloy, nickel, nickel alloy, or steel use stainless (SUS). Lid 16 can protect electronic component 12 and electronic components 14 from exposure to external factors or environments. Lid 16 can radiate heat generated from electronic component 12 outward. In some examples, the thickness of lid 16 can range from about 100 μm to about 2000 μm. A central portion of lid 16 can be attached or coupled to the top side of electronic component 12 through thermal interface material (TIM) 162. The edge of lid 16 can be attached or coupled to top portion 151 of encapsulant 15 through adhesive 164.

In some examples, TIM 162 can be provided between lid 16 and electronic component 12. TIM 162 can be between a top side of electronic component 12 and a bottom side of lid 16. In some examples, TIM 162 can be in contact with BSM 124 of electronic component 12. In some examples, TIM 162 can comprise metal, polymer, or metal-polymer hybrid. TIM 162 can transfer heat generated from electronic component 12 to lid 16. In some examples, the thickness of TIM 162 can range from about 10 μm to about 200 μm.

In some examples, adhesive 164 can comprise or be referred to as an interface material, an adhesive film, or an adhesive tape. Adhesive 164 can be provided between lid 16 and encapsulant 15. In some examples, adhesive 164 can be in contact with top portion 151 of encapsulant 15. In some examples, adhesive 164 can comprise a thermally curable adhesive, a photo-curable adhesive, or a non-curable adhesive, for example a rubber-based adhesive, an acryl-based adhesive, a vinyl alkyl ether-based adhesive, a silicone-based adhesive, a polyester-based adhesive, a polyamide-based adhesive, or an urethane-based adhesive. In some examples, adhesive 164 can be dielectric or electrically conductive. In some examples, adhesive 164 can be provided on top portion 151 of encapsulant 15, and after lid 16 is provided on adhesive 164, adhesive 164 can be cured to attach or fix lid 16 to encapsulant 15. In some examples, the thickness of adhesive 164 can range from about 30 μm to about 200 μm.

Figures 2F, 2G:
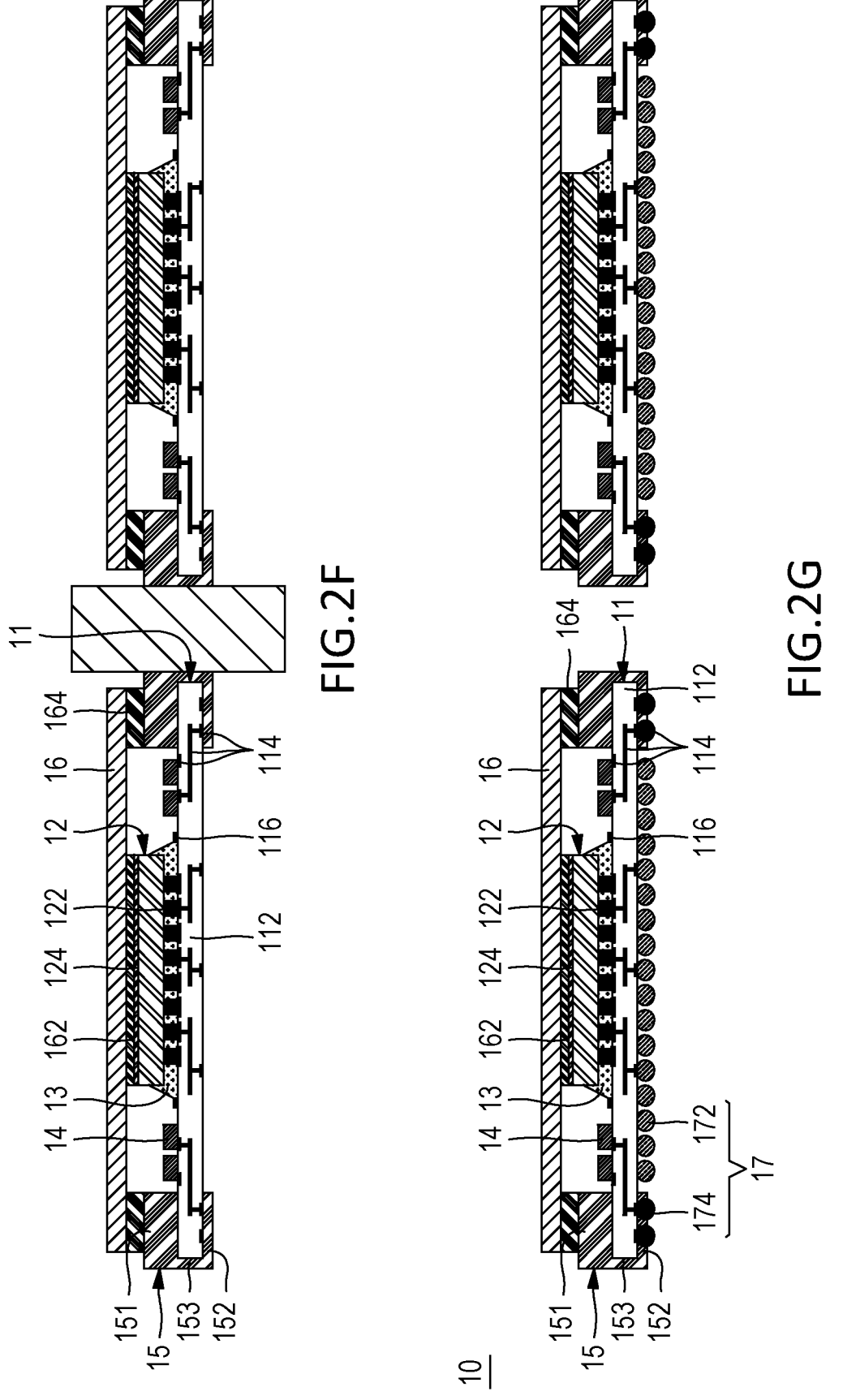

FIG. 2F shows a cross-sectional view of electronic device 10 at a later stage of manufacture. In the example shown in FIG. 2F, a singulation, dicing, or sawing process for separating substrates 11 in the form of a panel into individual electronic devices 10 can be provided. In some examples, in the singulation process, substrates 11 in forms of strips can be separated by using a sawing tool, such as a diamond blade or a laser beam. In some examples, in the singulation process, encapsulant 15 can be cut provided between substrates 11.

FIG. 2G shows a cross-sectional view of electronic device 10 at a later stage of manufacture. In the example shown in FIG. 2G, external interconnects 17 can be provided on the bottom side of substrate 11. External interconnects 17 can be coupled with conductive structure 114 exposed to the bottom side of substrate 11. In some examples, external interconnects 17 can comprise solder balls, land grid array (LGA) pads, pin grid array (PGA) pins, pillars, or bumps. In some examples, external interconnects 17 can couple electronic device 10 to an external device. In some examples, the thickness of each of external interconnects 17 can range from about 100 μm to about 500 μm.

In some examples, external interconnects 17 are composed of solder balls, and the solder ball external interconnects 172 can be located outside or external to encapsulant 15. Solder ball external interconnects 172 can comprise PB solder balls or Sn—Ag—Cu (SAC) solder balls. In some examples, solder balls 174 located in encapsulant 15 can comprise solder-coated-metal core solder balls, for example comprising a copper core. In some examples, solder balls 174 can provided at the outer portion of substrate 11 for keeping standoff height. In some examples, after removing a portion of bottom portion 152 of encapsulant 15 by etching to expose the bottom side of substrate 11, solder balls 174 can be attached to the bottom side of substrate 11. Solder balls 174 can be coupled to conductive structure 114 exposed to the bottom side of substrate 11. In some examples, bottom portion 152 of encapsulant 15 can wrap up or contact portions of solder balls 174. The thickness of each of solder balls 174 can be formed more thickly than the thickness of bottom portion 152 of encapsulant 15. In some examples, external interconnects 172 can be external to encapsulant 15, and encapsulant 15 can contact solder balls 174.

Figures 3, 4A:
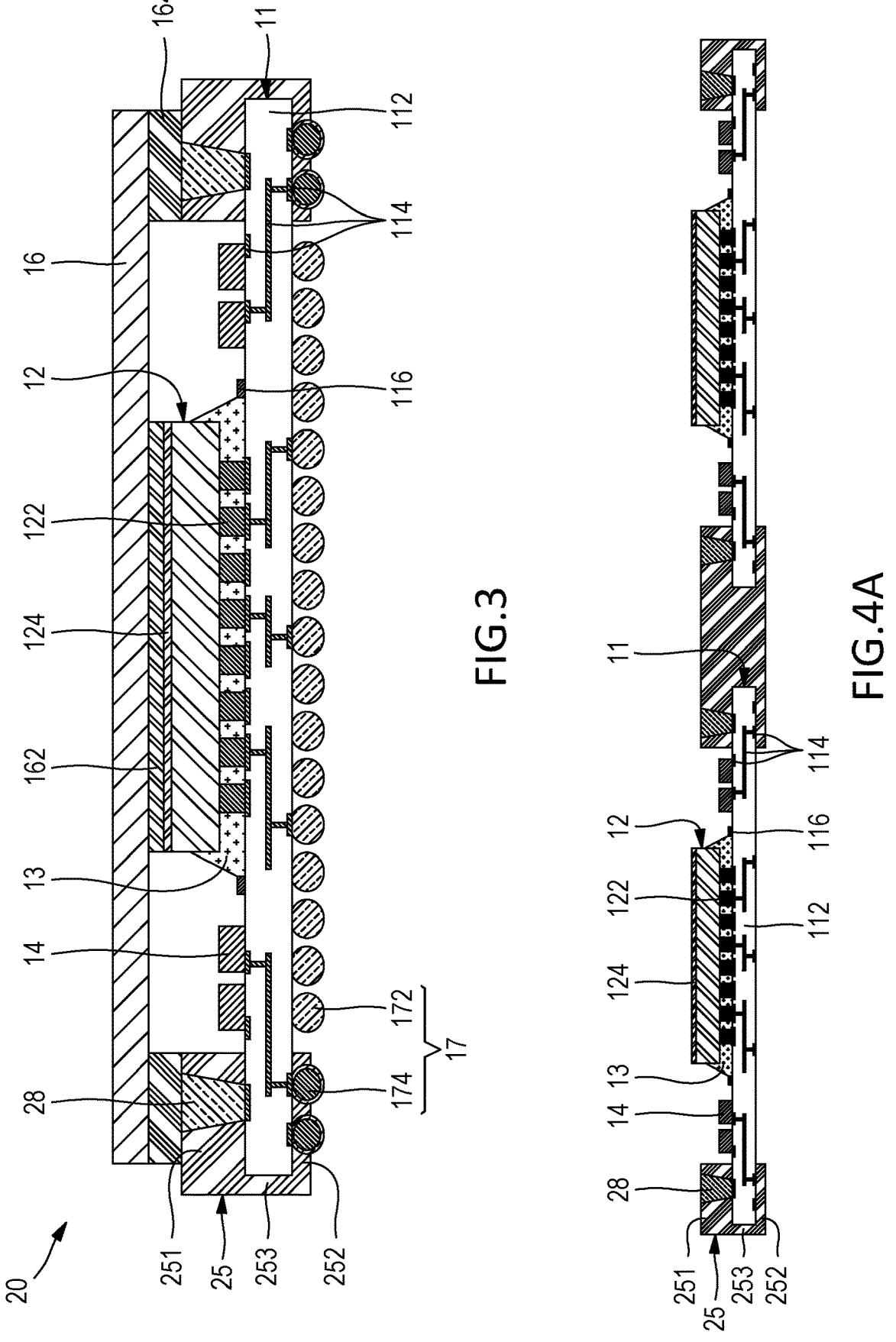
FIG. 3 shows a cross-sectional view of an example electronic device.
FIGS. 4A to 4D show cross-sectional views of an example method for manufacturing an example electronic device.

FIG. 3 shows a cross-sectional view an example electronic device. In the example shown in FIG. 3, electronic device 20 can comprise substrate 11, electronic component 12 and electronic components 14, underfill 13, encapsulant 25, lid 16, external interconnects 17, and internal interconnects 28. In some examples, electronic device 20 can comprise corresponding elements, features, materials, or formation processes similar to those of electronic device 10 previously described. In some examples, internal interconnect 28 can be over the top side of substrate 11 and can be coupled with conductive structure 114. In some examples, encapsulant 25 can contact a lateral side of internal interconnect 28. In some examples, internal interconnect 28 can be in encapsulant 25.

FIGS. 4A to 4D show cross-sectional views of an example method for manufacturing an example electronic device.

FIG. 4A shows a cross-sectional view of electronic device 20 at an early stage of manufacture. In the example shown in FIG. 4A, the operations described with respect to FIGS. 2A to 2D can be followed, and then internal interconnects 28 can provided in encapsulant 25. In some examples, encapsulant 25 can comprise corresponding elements, features, materials, or formation processes similar to those of encapsulant 15 previously described. Encapsulant 25 can comprise top portion 251 for molding the top side of substrate 11, bottom portion 252 for molding the bottom side of substrate 11, and side portion 253 for molding lateral sides of substrate 11. Internal interconnects 28 can be formed within top portion 251 of encapsulant 25. In some examples, internal interconnects 28 can comprise or be referred to as through mold vias (TMVs), TMVs with solder balls attached, copper pillars or posts, or E-bars. In some examples, internal interconnects 28 can be formed by etching top portion 251 of encapsulant 25 to form vias, and filling the vias with a conductive material. Internal interconnects 28 can be coupled to conductive structure 114 of substrate 11. The top sides of internal interconnects 28 can be coplanar with the top side of top portion 251 of encapsulant 25. The height of internal interconnects 28 can correspond to the thickness of top portion 251 of encapsulant 25.

Figures 4B, 4C:
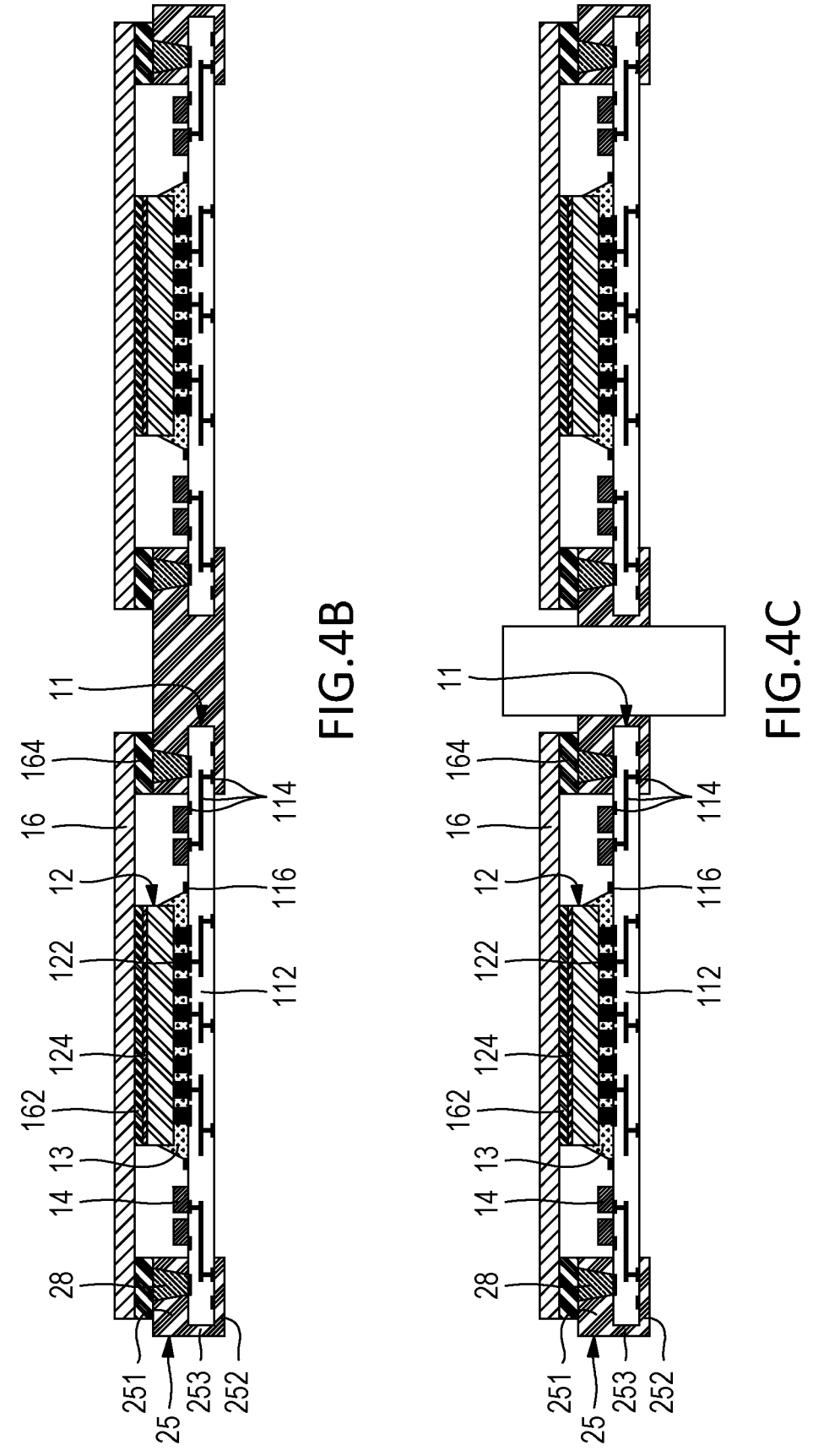

FIG. 4B shows a cross-sectional view of electronic device 20 at a later stage of manufacture. In the example shown in FIG. 4B, lid 16 can be provided on substrate 11. The edge of lid 16 can be attached or coupled to top portion 251 of encapsulant 25 through adhesive 164. Adhesive 164 can be in contact with internal interconnects 28. In some examples, lid 16 can be coupled to internal interconnects 28 through adhesive 164. In some examples, in conductive structure 114 of substrate 11, a ground pad can be coupled to lid 16 through internal interconnects 28.

FIG. 4C shows a cross-sectional view of electronic device 20 at a later stage of manufacture. In the example shown in FIG. 4C, a singulation, dicing, or sawing process for separating substrates 11 in the form of a panel into individual electronic devices 20 can be provided. In some examples, in the singulation process, encapsulant 25 can be cut provided between substrates 11.

Figures 4D, 5:
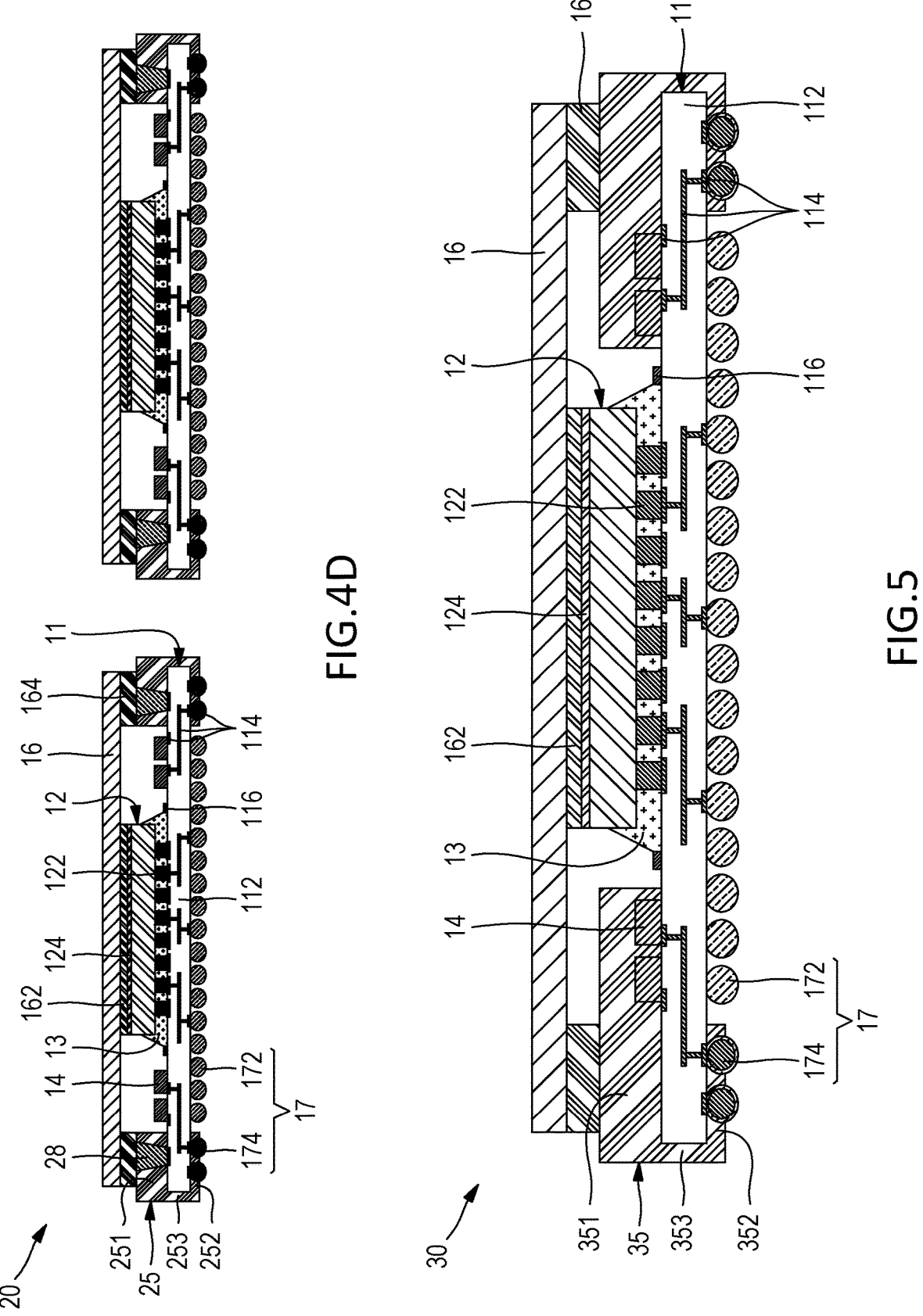
FIG. 5 shows a cross-sectional view of an example electronic device.

FIG. 4D shows a cross-sectional view of electronic device 20 at a later stage of manufacture. In the example shown in FIG. 4D, external interconnects 17 can be provided on the bottom side of substrate 11.

FIG. 5 shows a cross-sectional view an example electronic device. In the example shown in FIG. 5, electronic device 30 can comprise substrate 11, electronic component 12 and electronic components 14, underfill 13, encapsulant 35, lid 16, and external interconnects 17. In some examples, electronic device 30 can comprise corresponding elements, features, materials, or formation processes similar to those of electronic device 10 previously described. In some examples, encapsulant 35 can contact a lateral side of one or more electronic components 14. A portion of volume under lid 16 and extending from a lateral side of encapsulant 35 to a latera side of component 12 can be devoid of encapsulant 35.

Figures 6A, 6B:
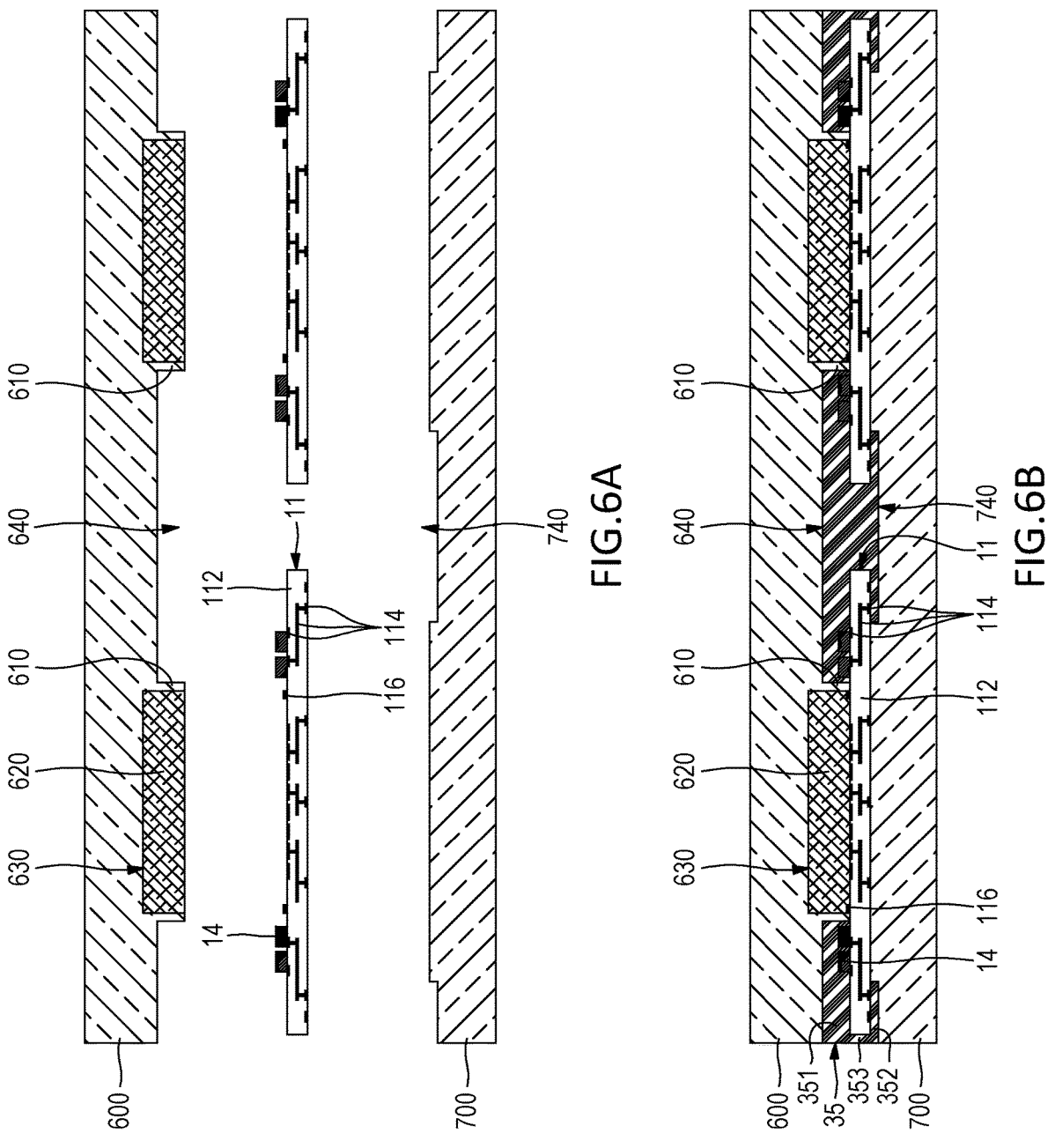
FIGS. 6A to 6F show cross-sectional views of an example method for manufacturing an example electronic device.

FIGS. 6A to 6F show cross-sectional views of an example method for manufacturing an example electronic device. FIG. 6A shows a cross-sectional view of electronic device 30 at an early stage of manufacture. In the example shown in FIG. 6A, substrates 11 can be provided between top mold chase 600 and bottom mold chase 700. Top mold chase 600 can comprise bar 610, pad 620, cavity 630, and cavity 640. Bar 610 can separate cavity 630 from cavity 640. Bar 610 can be provided between dam 116 and electronic component 14. Cavity 630 can be provided in the center of substrate 11, and pad 620 can be provided within cavity 630. In some examples, pad 620 can be in the type of a cushion having a cushioning action. In some examples, when encapsulant 35 is provided in cavity 640, pad 620 can protect dam 116 or electronic component 12 in cavity 630 from mold flash or over-sprayed parts. In some examples, dam 116 can be located in cavity 630. Cavity 640 can be provided on the edge of substrate 11, and can be a space for molding or a space where encapsulant 35 is provided. In some examples, the width of cavity 640 can be greater than the width of cavity 740. In some examples, dam 116 can be on the top side of substrate 11 and dam 116 can be between underfill 13 and electronic component 14.

FIG. 6B shows a cross-sectional view of electronic device 30 at a later stage of manufacture. In the example shown in FIG. 6B, encapsulant 35 can be provided within cavities 640 and 740. In some examples, encapsulant 35 can comprise corresponding elements, features, materials, or formation processes similar to those of encapsulant 15 previously described. Encapsulant 35 can comprise top portion 351 for molding the top side of substrate 11, bottom portion 352 for molding the bottom side of substrate 11, and side portion 353 for molding the lateral side of substrate 11. Top portion 351 of encapsulant 35 can be provided outside electronic component 12. In some examples, top portion 351 of encapsulant 35 can mold electronic component 14 and conductive structure 114 exposed to the top side of substrate 11. Top portion 351 of encapsulant 35 can protect electronic component 14 from exposure to external factors or environments. Bottom portion 352 of encapsulant 35 can mold conductive structure 114 exposed to the bottom side of substrate 11. The width of top portion 351 of encapsulant 35 can be greater than the width of bottom portion 352.

Figures 6C, 6D:
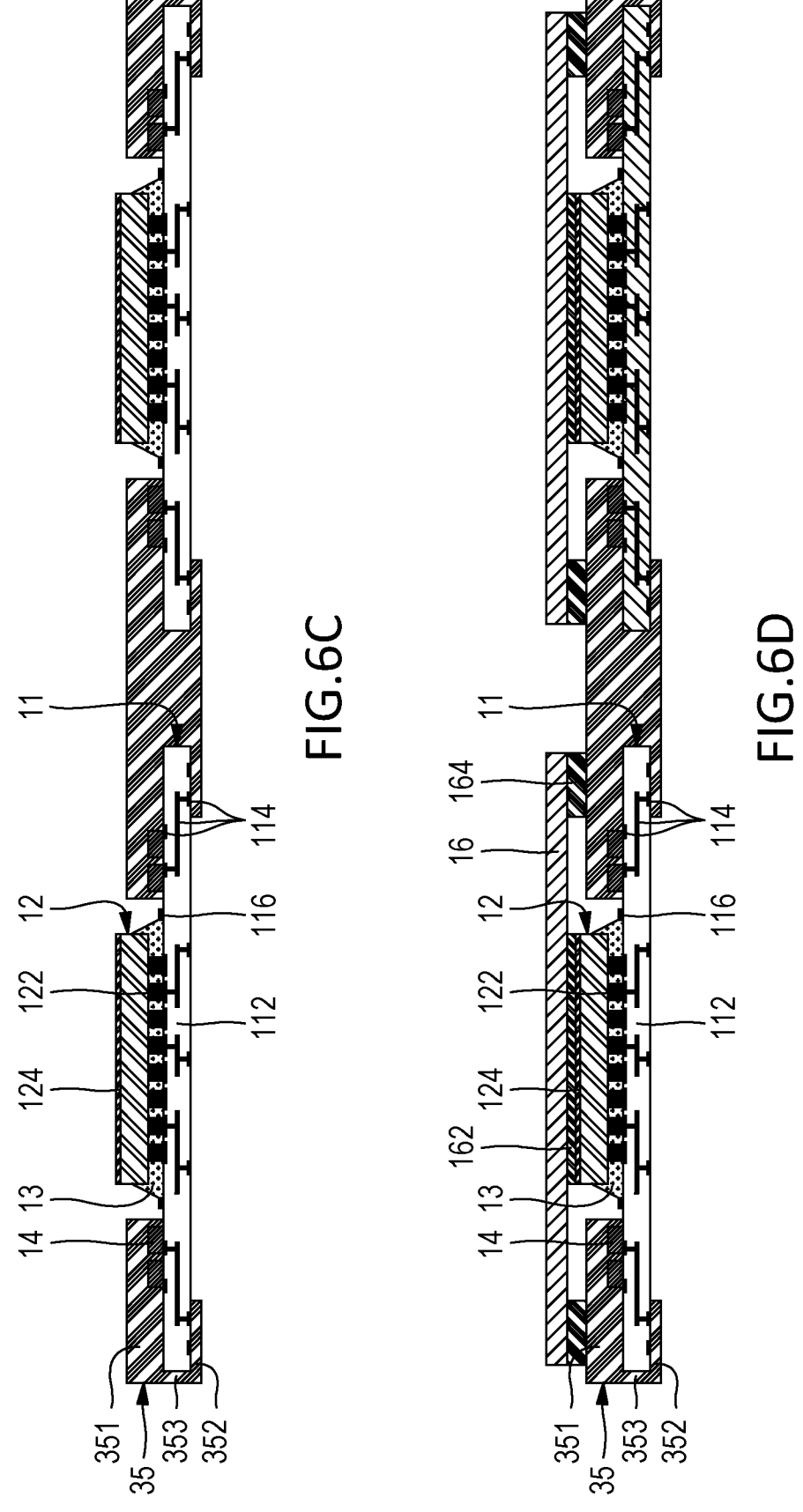

FIG. 6C shows a cross-sectional view of electronic device 30 at a later stage of manufacture. In the example shown in FIG. 6C, electronic component 12 can be provided on substrate 11, and underfill 13 can be provided between electronic component 12 and substrate 11.

FIG. 6D shows a cross-sectional view of electronic device 30 at a later stage of manufacture. In the example shown in FIG. 6D, lid 16 can be provided on substrate 11. The edge of lid 16 can be attached or coupled to top portion 351 of encapsulant 35 through adhesive 164.

Figures 6E, 6F:
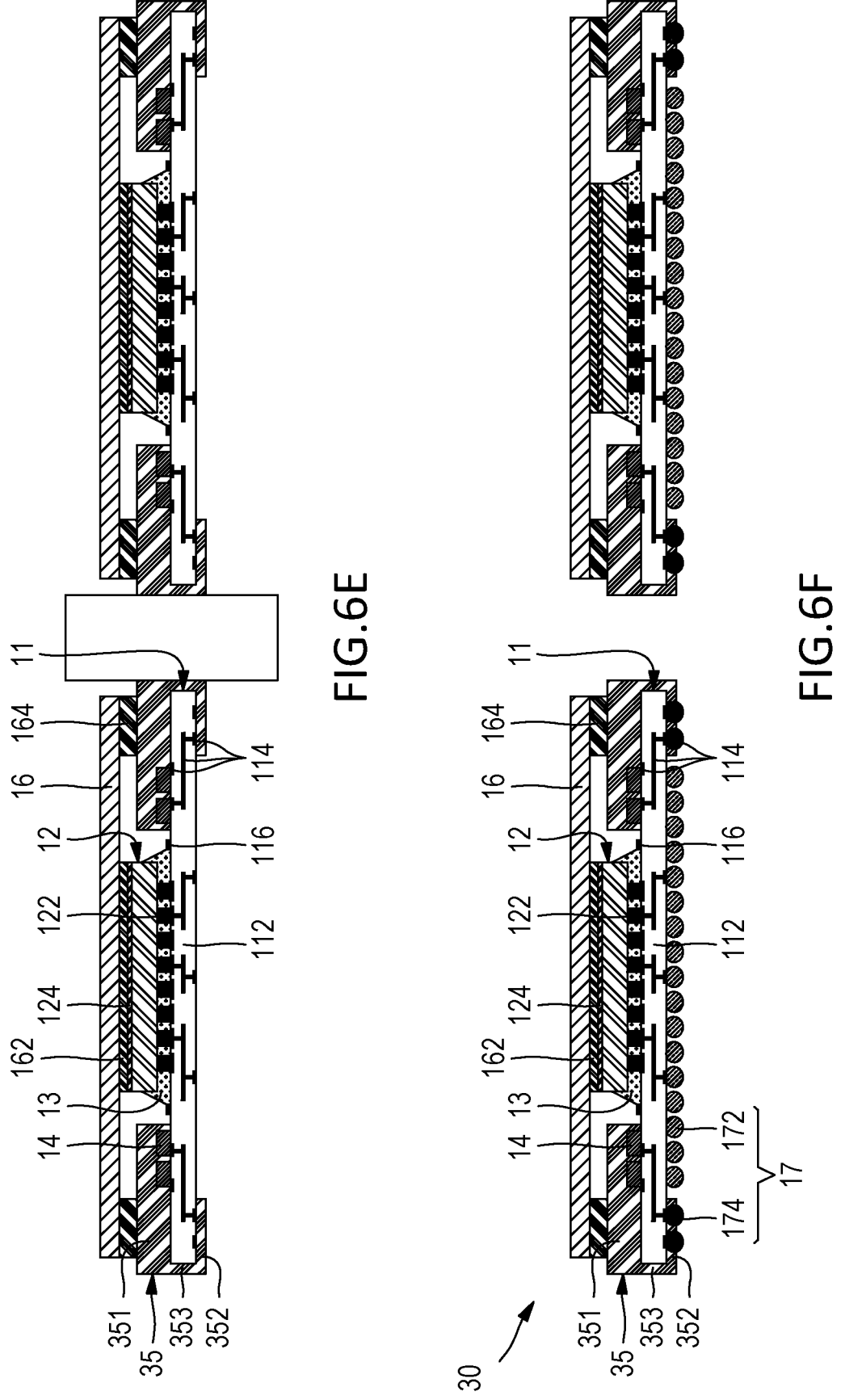

FIG. 6E shows a cross-sectional view of electronic device 30 at a later stage of manufacture. In the example shown in FIG. 6E, a singulation (or dicing, sawing) process for separating substrates 11 in the form of a panel into individual electronic devices 30 can be provided. In some examples, in the singulation process, encapsulant 35 can be cut provided between substrates 11.

FIG. 6F shows a cross-sectional view of electronic device 30 at a later stage of manufacture. In the example shown in FIG. 6F, external interconnects 17 can be provided on the bottom side of substrate 11.

The present disclosure includes reference to certain examples. It will be understood by those skilled in the art, however, that various changes may be made, and equivalents may be substituted, without departing from the scope of the disclosure. In addition, modifications may be made to the disclosed examples without departing from the scope of the present disclosure. Therefore, it is intended that the present disclosure is not limited to the examples disclosed, but that the disclosure will include all examples falling within the scope of the appended claims.

The invention claimed is:

1. An electronic device, comprising:
a substrate comprising a top side, a bottom side, a lateral side, and a conductive structure;
a first electronic component over the top side of the substrate and coupled with the conductive structure;
an encapsulant contacting the top side of the substrate, the bottom side of the substrate, and the lateral side of the substrate;
a lid over the first electronic component and over the encapsulant; and
a second electronic component over the top side of the substrate and coupled with the conductive structure, wherein the second electronic component is between the first electronic component and the lateral side of the substrate;
wherein the second electronic component is external to the encapsulant.

2. The electronic device of claim 1, further comprising:
an internal interconnect over the top side of the substrate and coupled with the conductive structure;
wherein the encapsulant contacts a lateral side of the internal interconnect.

3. The electronic device of claim 1, further comprising:
a plurality of external interconnects on the bottom side of the substrate and coupled with the conductive structure;
wherein a first external interconnect of the plurality of external interconnects is external to the encapsulant, and the encapsulant contacts a second external interconnect of the plurality of external interconnects.

4. The electronic device of claim 3, wherein:
the second external interconnect comprises a solder-coated metal core solder ball.

5. The electronic device of claim 1, further comprising:
a dam on the top side of the substrate; and
an underfill between the top side of the substrate and a bottom side of the first electronic component;
wherein the dam is between the underfill and the second electronic component.

6. An electronic device, comprising:
a substrate comprising a top side, a bottom side, a lateral side, and a conductive structure;
a first electronic component over the top side of the substrate and coupled with the conductive structure, wherein the first electronic component comprises a component interconnect on a bottom side of the first electronic component;
a second electronic component over the top side of the substrate and coupled with the conductive structure;
an encapsulant contacting the top side of the substrate, the bottom side of the substrate, and the lateral side of the substrate;
a lid over the first electronic component, over the second electronic component, and over the encapsulant; and
an underfill between the top side of the substrate and the bottom side of the first electronic component and contacting the component interconnect, wherein the second electronic component is external to the underfill.

7. The electronic device of claim 6, further comprising:
a dam on the top side of the substrate;
wherein the underfill is between the dam and the component interconnect, and the dam is between the underfill and the second electronic component.

8. The electronic device of claim 6, further comprising:
a thermal interface material between a top side of the first electronic component and a bottom side of the lid.

9. The electronic device of claim 8, further comprising:
a backside metallization (BSM) on the top side of the first electronic component and contacting the thermal interface material.

10. The electronic device of claim 6, further comprising:
an internal interconnect over the top side of the substrate and coupled with the conductive structure;
wherein the internal interconnect is in the encapsulant.

11. The electronic device of claim 6, wherein
the second electronic component is external to the encapsulant.

12. The electronic device of claim 6, wherein:
the second electronic component is in the encapsulant.

13. The electronic device of claim 6, wherein:
a top portion of the encapsulant covers a first portion of the conductive structure exposed at the top side of the substrate; and
a bottom portion of the encapsulant covers a second portion of the conductive structure exposed at the bottom side of the substrate.

14. A method to manufacture an electronic device, comprising:
providing a substrate comprising a top side, a bottom side, a lateral side, a conductive structure, and a first electronic component over the top side of the substrate and coupled with the conductive structure;
providing a top mold chase over the top side of the substrate and a bottom mold chase below the bottom side of the substrate, wherein the top mold chase has a first cavity between a first bar and a second bar, wherein the bottom mold chase has a second cavity;
providing an encapsulant contacting the top side of the substrate, the bottom side of the substrate, and the lateral side of the substrate, wherein the encapsulant is external to the first cavity and is in the second cavity;
removing the top mold chase and the bottom mold chase;
providing a second electronic component over the top side of the substrate and coupled with the conductive structure; and
providing a lid over the top side of the substrate, wherein the lid is over the first electronic component, the second electronic component, and the encapsulant;
wherein the second electronic component is external to the encapsulant.

15. The method of claim 14, wherein:
providing top mold chase over the top side of the substrate comprises locating the first electronic component in the first cavity of the top mold chase; and
the first bar prevents the encapsulant from contacting the first electronic component.

16. The method of claim 14, wherein:
providing the top mold chase over the top side of the substrate comprises:
locating a pad in the first cavity of the top mold chase; and locating the first electronic component external to the first cavity of the top mold chase; and
wherein the encapsulant contacts a lateral side of the first electronic component.

17. The method of claim 14, further comprising:
providing an internal interconnect over the top side of the substrate and coupled with the conductive structure;
wherein providing the top mold chase over the top side of the substrate comprises locating the internal interconnect external to the first cavity of the top mold chase; and
wherein the encapsulant contacts a lateral side of the internal interconnect.

18. The method of claim 14, further comprising:
providing a first external interconnect on the bottom side of the substrate and coupled with the conductive structure; and
providing a second external interconnect on the bottom side of the substrate;
wherein the first external interconnect is external to the encapsulant and the encapsulant contacts the second external interconnect.

19. An electronic device, comprising:
a substrate comprising a top side, a bottom side, a lateral side, and a conductive structure;
a dam on the top side of the substrate;
a first electronic component over the top side of the substrate and coupled with the conductive structure;
an underfill between the top side of the substrate and a bottom side of the first electronic component;
an encapsulant contacting the top side of the substrate, the bottom side of the substrate, and the lateral side of the substrate;
a lid over the first electronic component and over the encapsulant; and
a second electronic component over the top side of the substrate and coupled with the conductive structure, wherein the second electronic component is between the first electronic component and the lateral side of the substrate;
wherein the dam is between the underfill and the second electronic component.

20. The electronic device of claim 1, wherein:
the second electronic component is external to the encapsulant.

21. The electronic device of claim 1, further comprising:
a plurality of external interconnects on the bottom side of the substrate and coupled with the conductive structure;
wherein a first external interconnect of the plurality of external interconnects is external to the encapsulant, and the encapsulant contacts a second external interconnect of the plurality of external interconnects.

22. The electronic device of claim 21, wherein:
the second external interconnect comprises a solder-coated metal core solder ball.

* * * * *